US006646304B1

United States Patent
Tihanyi et al.

(10) Patent No.: US 6,646,304 B1
(45) Date of Patent: Nov. 11, 2003

(54) UNIVERSAL SEMICONDUCTOR WAFER FOR HIGH-VOLTAGE SEMICONDUCTOR COMPONENTS

(75) Inventors: Jenö Tihanyi, Kirchheim (DE); Reinhard Ploss, Puchheim (DE)

(73) Assignee: Infineon Technologies AG, Munich (DE)

( * ) Notice: Subject to any disclaimer, the term of this patent is extended or adjusted under 35 U.S.C. 154(b) by 229 days.

(21) Appl. No.: 09/688,922

(22) Filed: Oct. 16, 2000

Related U.S. Application Data

(63) Continuation of application No. PCT/DE99/00327, filed on Feb. 8, 1999.

(30) Foreign Application Priority Data

Apr. 14, 1998 (DE) .......................................... 198 16 448

(51) Int. Cl.[7] .......................... H01L 29/76; H01L 23/58
(52) U.S. Cl. ........................ 257/341; 257/401; 257/490; 257/492; 257/495; 257/496
(58) Field of Search ................................. 257/341, 401, 257/490, 492, 495, 496

(56) References Cited

U.S. PATENT DOCUMENTS

| 4,025,365 | A |   | 5/1977 | Martin et al. |
|---|---|---|---|---|
| 4,656,493 | A |   | 4/1987 | Adler et al. |
| 5,111,254 | A |   | 5/1992 | Levinson et al. |
| 5,438,215 | A | * | 8/1995 | Tihanyi ....................... 257/401 |
| 5,753,942 | A | * | 5/1998 | Seok ........................... 257/133 |
| 6,037,632 | A | * | 3/2000 | Omura et al. ................ 257/341 |
| 6,184,555 | B1 |  | 2/2001 | Tihanyi et al. |

FOREIGN PATENT DOCUMENTS

| DE | 24 39 430 A1 | 3/1976 |
|---|---|---|
| DE | 26 17 320 A1 | 11/1977 |
| DE | 196 04 044 A1 | 8/1997 |
| EP | 0 426 252 A2 | 5/1991 |
| EP | 0 663 698 A1 | 7/1995 |
| FR | 2 525 587 | 11/1983 |
| GB | 2 163 597 A | 2/1986 |

OTHER PUBLICATIONS

M. H. Hanes et al.: "Radiation–Hard Static Induction Transistor", *I.E.E.E. Trans. on Nuclear Science,* vol. 35, Dec. 1988, No. 6, pp. 1475–1479.

* cited by examiner

*Primary Examiner*—Eddie Lee
*Assistant Examiner*—Joseph Nguyen
(74) *Attorney, Agent, or Firm*—Laurence A. Greenberg; Werner H. Stemer; Ralph E. Locher

(57) ABSTRACT

A universal semiconductor wafer for high-voltage semiconductor components includes at least one layer of a first conductivity type which is provided on a semiconductor substrate of the first conductivity type. A plurality of floating semiconductor zones of a second, opposite conductivity type are embedded in the interface region between the semiconductor substrate and the at least one layer. The floating semiconductor zones are dimensioned such that the dimension of a semiconductor zone is do small compared to the layer thickness of the at least one semiconductor layer and is essentially equal to or less than a distance between the floating semiconductor zones in the interface region.

13 Claims, 2 Drawing Sheets

US 6,646,304 B1

UNIVERSAL SEMICONDUCTOR WAFER FOR HIGH-VOLTAGE SEMICONDUCTOR COMPONENTS

CROSS-REFERENCE TO RELATED APPLICATION

This application is a continuation of copending International Application No. PCT/DE99/00327, filed Feb. 8, 1999, which designated the United States.

BACKGROUND OF THE INVENTION

1. Field of the Invention

The invention relates to a universal semiconductor wafer for high-voltage semiconductor components, in which at least one layer of a given conductivity type is provided on a semiconductor substrate of the given conductivity type. The invention further relates to a method of fabricating such a universal semiconductor wafer.

In order to be able to fabricate high-voltage semiconductor components, such as, for example, diodes, IGBTs (insulated gate bipolar transistors), MOSFETs or GTOs (gate turn-off thyristors), with the least possible outlay, a universal semiconductor wafer should be usable as a base material for all of these components. However, it has so far been necessary to optimize the respective base wafers for the individual, different high-voltage semiconductor components in accordance with the required voltage classes of the individual semiconductor components, for example by correspondingly doping the epitaxial layer and selecting a wafer thickness.

Current-switching semiconductor components for high voltages, such as IGBTs for example, are, especially if inductive loads are to be switched, more sensitive to interference, the higher the reverse or blocking voltage is. It is thus known that the operational reliability of high-voltage IGBTs, for example, is particularly jeopardized by cosmic radiation. In order to eliminate this susceptibility to interference, thought might be given to weakly doping the blocking region in the semiconductor wafer in order that high voltages can be blocked. However, limits are imposed on such a procedure because, if current flows at a high applied voltage, the charge carriers, which pass through the blocking region or the blocking path with a limiting velocity of.the order of magnitude of about $10^7$ cm/s, are present in an extremely high concentration even with small current densities. This high concentration of charge carriers then comes close to the doping, so that a distortion of the electric field occurs, which can lead to destruction of the semiconductor component if the switched current assumes relatively high values. So far only thyristors have withstood high currents at a high reverse voltage. However, the thyristors have to be turned off in the event of a small applied voltage or a voltage inversion and can therefore not be regarded as "genuine" switches.

2. Summary of the Invention

It is accordingly an object of the invention to provide a universal semiconductor wafer for high-voltage semiconductor components which overcomes the above-mentioned disadvantages of the heretofore-known wafers of this general type and which can be used in a diverse manner and is suitable especially for be high-voltage current switches which are to a large degree insensitive to cosmic radiation. It is a further object of the invention to provide a method of producing such a wafer.

With the foregoing and other objects in view there is provided, in accordance with the invention, a universal semiconductor wafer for high-voltage semiconductor components, including:

a semiconductor substrate of a first conductivity type;

at least one layer of the first conductivity type disposed on the semiconductor substrate;

the at least one layer having a given layer thickness and forming an interface region between the at least one layer and the semiconductor substrate;

a plurality of floating semiconductor zones of a second conductivity type different from the first conductivity type, the floating semiconductor zones being embedded in the interface region; and the floating semiconductor zones being spaced apart from one another by a given distance in the interface region, and at least one of the floating semiconductor zones having a given dimension substantially corresponding at most to the given distance and the given dimension being small compared to the given layer thickness of the at least one layer.

In other words, the object of the invention is achieved by virtue of the fact that a plurality of floating semiconductor zones of the second conductivity type are embedded in the interfaces between the semiconductor substrate and the layers. The zones are dimensioned in such a way that the dimension of a floating zone is small relative to the layer thickness of the layer and essentially corresponds to the distance between the conductive zones in an interface, or is smaller than the distance.

In this case, the individual layers may be epitaxial layers or be applied by direct wafer bonding. The floating semiconductor zones are preferably introduced by diffusion or ion implantation or implantation and subsequent diffusion into the surface of the configuration currently present, before the next layer is applied thereto by epitaxy or by direct wafer bonding.

Furthermore, the individual layers may preferably also be applied undoped and only subsequently be doped by neutron transmutation.

The semiconductor zones, which, if appropriate, may also be connected in a lattice-like manner, are preferably provided in a plurality of planes which are essentially parallel to one another. These planes are produced in a straightforward manner during the deposition of the individual epitaxial layers or during the application of the layers by direct wafer bonding. During the switching-on of a semiconductor component, for example an IGBT, using such a universal semiconductor wafer, in which a positive voltage is applied between gate and source, firstly a space charge zone or depletion zone is generated in the topmost semiconductor layer adjoining gate and source. If this space charge zone reaches the floating semiconductor zones bounding the topmost semiconductor layer with respect to the next semiconductor layer, then the voltage at these zones remains at the value $V_{pth}$ which has been reached. This corresponds to a "punch-through" situation. If the voltage applied to the drain is increased further, the space charge zone or depletion zone forms in the second-uppermost semiconductor layer and finally reaches the second plane of the semiconductor zones. This operation is repeated until the space charge zone finally reaches a heavily doped zone of the first conductivity type on the side of the drain contact. As a result, a structure can thus be obtained which has N+1 times the dielectric strength of the same structure without semiconductor zones, if the number of planes of the semiconductor zones is given by N.

The one (first) conductivity type is preferably the n conductivity type, so that the other (second) conductivity type is given by the p conductivity type and the floating semiconductor zones are thus p-doped. It goes without saying, however, that doping with the conductivity types reversed is also possible.

In the last-mentioned example of an IGBT, the heavily doped semiconductor layer of one conductivity type, that is to say preferably an $n^+$-conducting buffer layer, may also be replaced by another layer, for example by a so-called "non-punchthrough" structure.

The semiconductor zones are doped in such a way that the space charge zones or depletion zones completely fill the individual semiconductor layers, when a voltage is applied, before a breakdown occurs. In this case, the doping of the semiconductor zones is high enough that they are not completely depleted. This applies preferably to the central region of the semiconductor component but not to the edge regions. There the doping of the semiconductor zones may be so low that they are depleted when the voltage is applied.

In accordance with another feature of the invention, additional floating semiconductor zones are disposed in a sporadic manner between the floating semiconductor zones. The additional semiconductor zones are of the first conductivity type and have a first doping concentration. The at least one layer of the first conductivity type has a second doping concentration smaller than the first doping concentration.

The universal semiconductor wafer according to the invention is suitable, in a particularly advantageous manner, for fabricating diodes, MOSFETs with a field plate edge or IGBTs and/or GTOs with planar edge structures, or else for other semiconductor components, such as, for example, "Non-punch-through IGBTs" with a rear side that has been ground to be thin.

With the objects of the invention in view there is also provided, a method for fabricating a universal semiconductor wafer, which includes the steps of:
  providing a semiconductor substrate of a first conductivity type;
  forming a plurality of floating semiconductor zones of a second conductivity type different from the first conductivity type in a boundary region of the semiconductor substrate by one of a diffusion step and an implantation step;
  forming at least one layer of the first conductivity type on the semiconductor substrate; and
  spacing the floating semiconductor zones from one another by a given distance such that a respective given dimension of the floating semiconductor zones substantially corresponds at most to the given distance and such that the respective given dimension is small compared to a given layer thickness of the at least one layer.

In accordance with another mode of the invention, the semiconductor zones are doped with a first doping concentration in a central region of the semiconductor substrate; and the semiconductor zones are doped with a second doping concentration smaller than the first doping concentration in an edge region of the semiconductor substrate.

In accordance with a further mode of the invention, further floating semiconductor zones of the second conductivity type are formed in boundary regions between the plurality of layers.

In accordance with another mode of the invention, lifetime killers, such as platinum or gold, are implanted, introduced or provided in any other way at interface regions between the it plurality of layers.

In accordance another mode of the invention, the universal semiconductor wafer according to the invention is used in a diode, a MOSFET, an IGBT, a GTO or any other switching device.

Other features which are considered as characteristic for the invention are set forth in the appended claims.

Although the invention is illustrated and described herein as embodied in a universal semiconductor wafer for high-voltage semiconductor components and in a method of fabricating such a wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
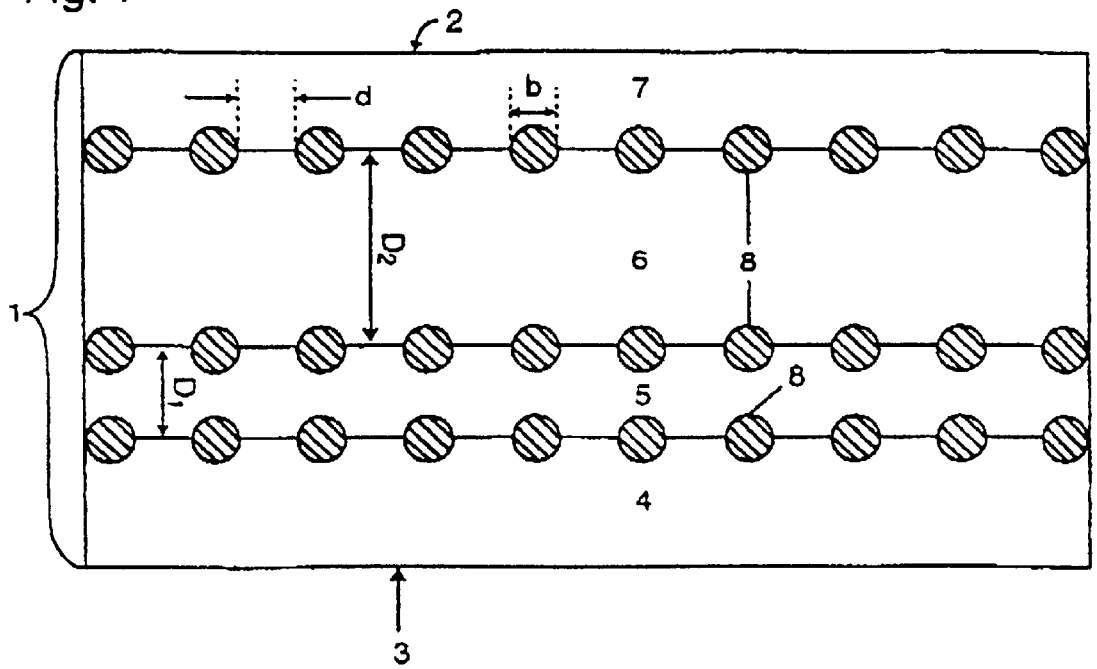
FIG. 1 is a sectional view of a universal semiconductor wafer according to the invention.

Although FIGS. 1 to 4 show sectional views, hatchings have been partially omitted therein in order to simplify the illustration. Moreover, mutually corresponding structural parts are each provided with the same reference symbols in the figures. Referring now to the figures of the drawings in detail and first, particularly, to FIG. 1 thereof, there is shown a universal semiconductor wafer 1 having a front side 2 and a rear side 3, in which an n-conducting epitaxial layer 5 having a doping concentration $n_1$, a second n-conducting epitaxial layer 6 having a doping concentration $n_2$ and a third n-conducting epitaxial layer 7 having a doping concentration $n_3$ are provided one after the other on an n-conducting substrate 4 having a doping concentration $n_0$. Instead of the epitaxial layers 5, 6 and 7, corresponding layers may also be provided by direct wafer bonding. Moreover, the doping concentrations in the lithium substrate 4 and in the epitaxial layers 5, 6 and 7 may each be identical to one another.

The epitaxial layers 5, 6 and 7 may be deposited undoped and subsequently be doped by neutron transmutation.

According to the invention, respective p-conducting zones 8 are situated between the substrate 4 and the layer 5, and also between the layer 5 and the layer 6 and between the layer 6 and the layer 7. The zones 8 may each form "islands" or else be connected in a lattice-like manner. These zones 8 are introduced by diffusion or ion implantation prior to the application of the respectively succeeding layer 5 or 6 or 7. Thus, by way of example, the zones 8 of the bottommost plane in FIG. 1 are introduced by diffusion or ion implantation into the surface of the substrate 4 before the layer 5 is deposited epitaxially. After the deposition of the layer 5, the zones 8 of the "middle" plane are introduced by diffusion or ion implantation. Finally, after the deposition of the epitaxial layer 6, the zones 8 of the topmost plane are introduced before the layer 7 is subsequently deposited epitaxially.

Lifetime killers, such as platinum and/or gold for example, may be implanted, or introduced in some other way, between the individual epitaxial layers, in the interfaces thereof.

The individual zones 8 "float", even if, as has already been mentioned, they may be connected at least partially or completely in a plane.

The distance d between the individual zones 8 of a plane corresponds approximately to the diameter b of the zones or is somewhat larger than the diameter. In addition, the distance d between the individual zones 8 of a plane is less than the distance $D_1$, $D_2$ between the individual planes.

The universal semiconductor wafer according to the invention is suitable, in an advantageous manner, for diodes, MOSFETs with a field plate edge, IGBTs, GTOs with planar edge structures, or other semiconductor components, such as, for example, "Non-punch-through IGBTs" with a rear side 3 that has been ground thin.

Figure 2:
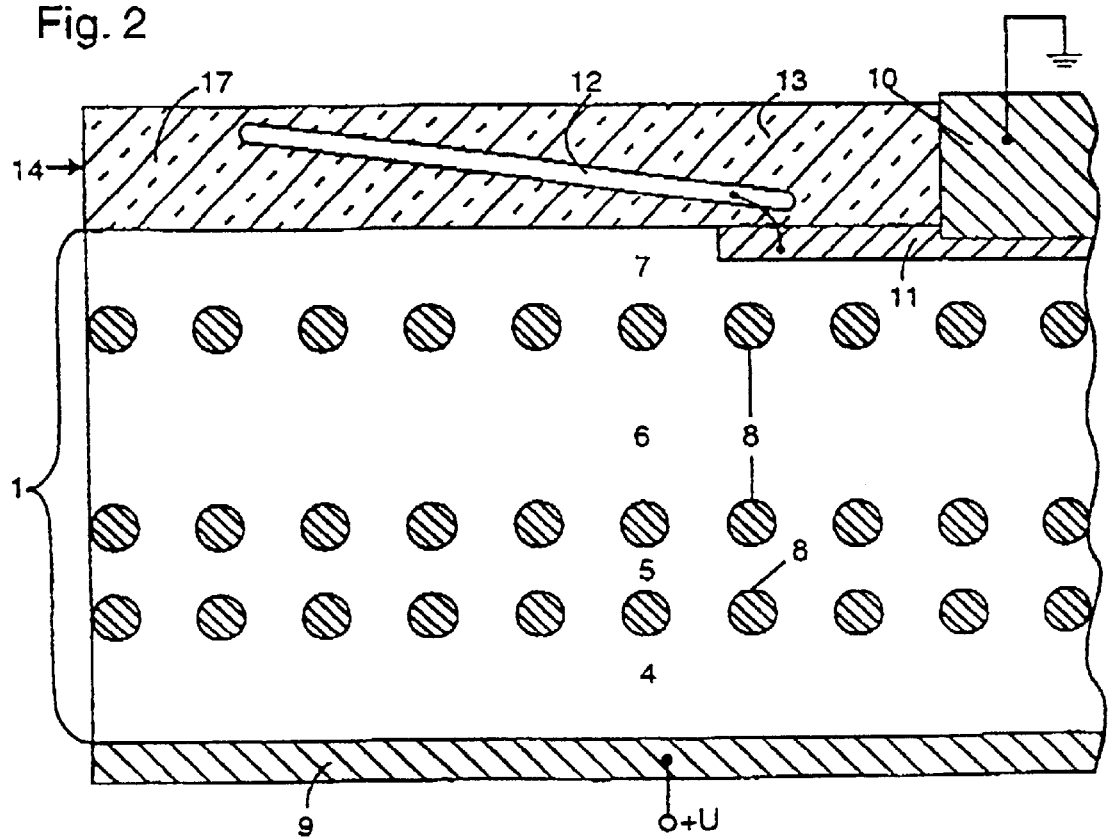
FIG. 2 is a partial sectional view of a diode of the universal semiconductor wafer according to the invention.

An example of a diode having aluminum electrodes 9, 10, a p-conducting zone 11, a field plate 12 and an insulating layer 13 made of silicon dioxide is shown in FIG. 2. The doping concentration in the zones 8 in the region of the edge 14 of this diode is somewhat weaker than the doping concentration of the zones 8 in the central region of the diode, that is to say essentially below the zone 11 in FIG. 2. Thus, in the central region the zones 8 are doped to an extent such that they are not completely depleted of charge carriers when a voltage is applied between the electrodes 9, 10. This is not the case for the region in proximity to the edge 14, where the zones 8 are only doped to an extent such that they are actually depleted when the voltage is applied.

By way of example, a voltage +U is applied to the electrode 9, while the electrode 10 may be grounded. Like the doping of the zones 8, which becomes weaker in the region of the edge 14, the field plate 12 serves for preventing a breakdown in the region of the edge 14 of the diode.

Figure 3:
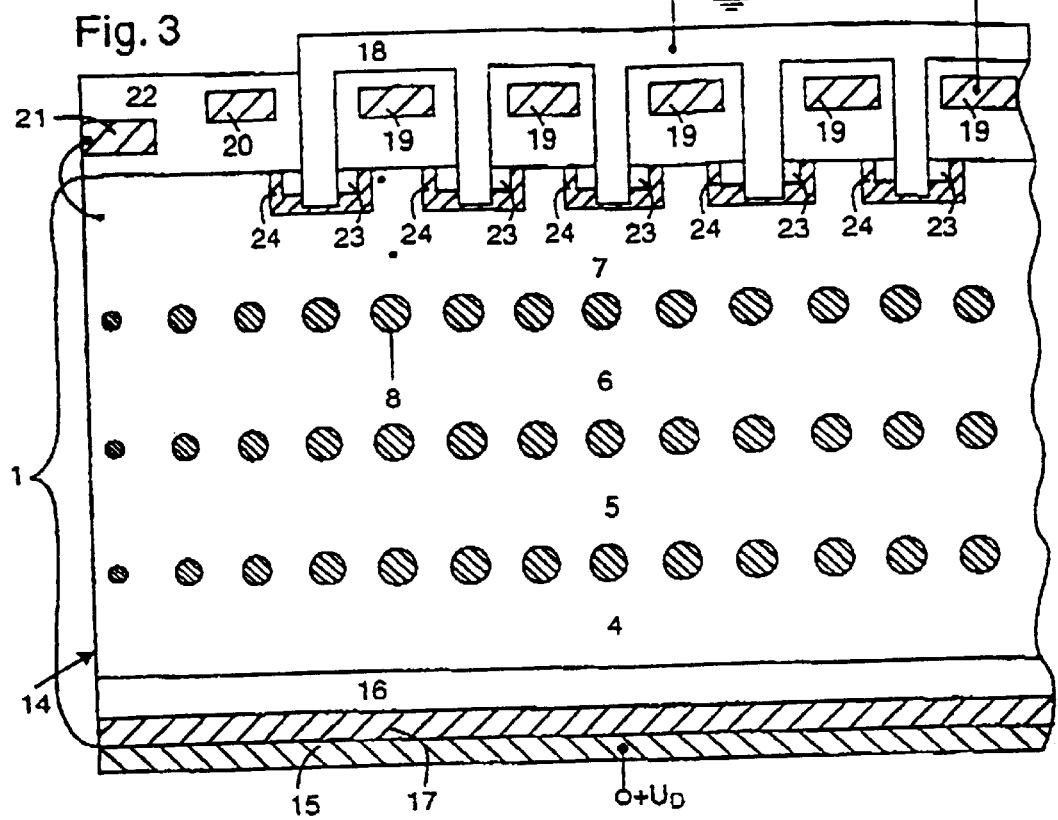
FIG. 3 is a partial sectional view of an IGBT with the universal semiconductor wafer according to the invention.
Figure 4:
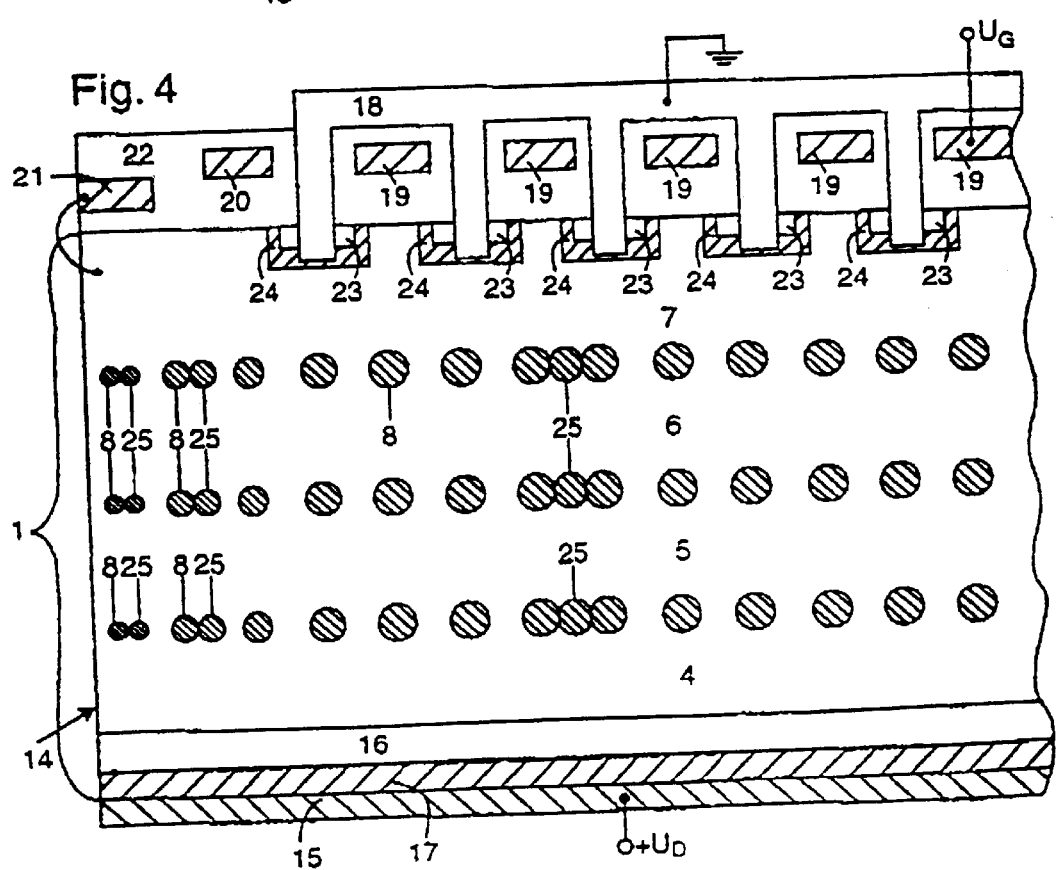
FIG. 4 is a partial sectional view of a modified IGBT with the universal semiconductor wafer according to the invention.

FIGS. 3 and 4 each show a section through an IGBT having the universal semiconductor wafer 1 according to the invention. This universal semiconductor wafer 1 additionally has an $n^+$-conducting layer 16 and a $p^+$-conducting layer 17, on which there is applied a drain contact 15 for a drain terminal D having a voltage $+U_D$. Also shown are a source metallization layer 18, which is grounded, gate electrodes 19 made of polycrystalline silicon, which are interconnected and to which a gate voltage $U_g$ is applied, a field plate 20 made of polycrystalline silicon, which is connected to the source metallization layer 18, and a channel stopper 21 made of polycrystalline silicon, which is electrically connected to the layer 7. The gate electrodes 19, the field plate 20 and the channel stopper 21 are embedded in an insulating layer 22 made, for example, of silicon dioxide and/or silicon nitride, which also forms the gate oxide underneath the gate electrodes 19. In the surface region of the layer 7 there are also situated $n^+$-conducting regions 23 and p-conducting regions 24, which together form respective source zones with which contact is made by the source metallization layer 18.

When the IGBT is switched on, that is to say when a voltage $+U_{GS}$ is applied between gate electrodes 19 and source metallization layer 18, firstly a space charge zone or depletion zone forms in the topmost layer 7. If this space charge or depletion zone reaches the topmost plane of the p-conducting semiconductor zones 8 between the layers 6 and 7 at a voltage value $V_{pth}$, the voltage of the semiconductor zone 8 remains at the voltage value $V_{pth}$ and a "punch-through" situation occurs. If the drain voltage $U_D$ is increased further, the space charge zone forms in the layer 6 and finally reaches the semiconductor zones between the layers 5 and 6. This continues until the space charge zone finally reaches the $n^+$-conducting layer 16. As a result, the dielectric strength achieved is quadruple that which could be achieved with a structure with solely n-type doping without the p-doped zones 8. The dielectric strength can be increased further by additional planes having semiconductor zones 8.

Instead of the $n^+$-doped semiconductor layer 16, the $p^+$-doped semiconductor.layer 17 and the source zones 23, 24, it is also possible to provide other layers in order to form a GTO, a MOSFET or other semiconductor components.

The diminishing doping of the semiconductor zones 8 in the region of the edge 14 may also be achieved by additionally assigning heavily $n^+$-doped semiconductor zones 25 to the $p^+$-doped semiconductor zones 8, as is shown in the exemplary embodiment of FIG. 4.

We claim:

1. A universal semiconductor wafer for high-voltage semiconductor components, comprising:
    a semiconductor substrate of a first conductivity type;
    at least one layer of said first conductivity type disposed on said semiconductor substrate;
    said at least one layer having a given layer thickness and forming an interface region between said at least one layer and said semiconductor substrate;
    a plurality of floating semiconductor zones of a second conductivity type different from said first conductivity type, said floating semiconductor zones being embedded in said interface region; and
    said floating semiconductor zones being spaced apart from one another by a given distance in said interface region, and at least one of said floating semiconductor zones having a given dimension substantially corresponding at most to said given distance and said given dimension being small compared to said given layer thickness of said at least one layer.

2. The universal semiconductor wafer according to claim 1, wherein said at least one layer is an epitaxial layer.

3. The universal semiconductor wafer according to claim 1, wherein said at least one layer is a wafer bond layer applied by direct wafer bonding.

4. The universal semiconductor wafer according to claim 1, wherein said floating semiconductor zones are diffusion zones.

5. The universal semiconductor wafer according to claim 1, wherein said floating semiconductor zones are ion-implanted zones.

6. The universal semiconductor wafer according to claim 1, wherein said floating semiconductor zones are deposited by implantation and subsequent outdiffusion prior to depositing said at least one layer.

7. The universal semiconductor wafer according to claim 1, wherein said at least one layer is applied as an undoped layer and subsequently doped by neutron transmutation.

8. The universal semiconductor wafer according to claim 1, wherein said semiconductor zones form a lattice.

9. The universal semiconductor wafer according to claim 1, wherein:
    said at least one layer is a plurality of layers defining a plurality of substantially parallel planes between respective ones of said layers; and
    further semiconductor zones of said second conductivity type are disposed in said substantially parallel planes.

10. The universal semiconductor wafer according to claim 1, wherein:
    said interface region has a central region and an edge region; and a first group of said floating semiconductor zones having a first doping concentration is disposed in said edge region and a second group of said floating semiconductor zones having a second doping concentration is disposed in said central region; and said first doping concentration is smaller than said second doping concentration.

11. The universal semiconductor wafer according to claim 1, including:

additional floating semiconductor zones disposed in a sporadic manner between said floating semiconductor zones, said additional semiconductor zones being of said first conductivity type and having a first doping concentration; and said at least one layer of said first conductivity type having a second doping concentration smaller than said first doping concentration.

12. The universal semiconductor wafer according to claim 1, wherein:

said interface region has a central region and an edge region; and said floating semiconductor zones are distributed in said central region and in said edge region and have respective doping concentrations such that, when a given voltage is applied, said floating semiconductor zones in said central region are not depleted and said floating semiconductor zones in said edge region are-depleted.

13. The universal semiconductor wafer according to claim 1, wherein:

said interface region has a central region and an edge region; and said floating semiconductor zones are distributed in said central region and in said edge region, said floating semiconductor zones in said central region having a first doping concentration, said floating semiconductor zones in said edge region having a second doping concentration smaller than said first doping concentration.

* * * * *